(12) United States Patent
Ye et al.

(10) Patent No.: US 10,566,357 B2
(45) Date of Patent: Feb. 18, 2020

(54) METHOD FOR CRYSTALLIZING METAL OXIDE SEMICONDUCTOR LAYER, SEMICONDUCTOR STRUCTURE, ACTIVE ARRAY SUBSTRATE, AND INDIUM GALLIUM ZINC OXIDE CRYSTAL

(71) Applicant: AU OPTRONICS CORPORATION, Hsin-chu (TW)

(72) Inventors: Jia-Hong Ye, Hsin-chu (TW); Ching-Liang Huang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 36 days.

(21) Appl. No.: 15/837,996

(22) Filed: Dec. 11, 2017

(65) Prior Publication Data

US 2018/0166474 A1    Jun. 14, 2018

(30) Foreign Application Priority Data

Dec. 13, 2016  (TW) .............................. 105141259 A

(51) Int. Cl.
  *H01L 27/12*     (2006.01)
  *H01L 29/786*   (2006.01)
  (Continued)

(52) U.S. Cl.
  CPC .... *H01L 27/1274* (2013.01); *H01L 21/02565* (2013.01); *H01L 21/02672* (2013.01);
  (Continued)

(58) Field of Classification Search
  CPC ........... H01L 27/1274; H01L 29/66742; H01L 27/1214; H01L 21/02672; H01L 27/1251;
  (Continued)

(56) References Cited

U.S. PATENT DOCUMENTS 7,955,916 B2    6/2011   Hayashi et al.
8,865,529 B2   10/2014   Sugawara
(Continued)

FOREIGN PATENT DOCUMENTS

CN      1519888 A      8/2004
CN    102484139 A      5/2012
(Continued)

OTHER PUBLICATIONS

Office Action issued by (TIPO) Intellectual Property Office, Ministry of Economic Affairs, R. O. C. on May 31, 2017 for Application No. 105141259, Taiwan.
(Continued)

*Primary Examiner* — Steven H Loke
*Assistant Examiner* — Juanita B Rhodes
(74) *Attorney, Agent, or Firm* — Tim Tingkang Xia, Esq.; Locke Lord LLP

(57) ABSTRACT

The present invention provides a method for crystallizing a metal oxide semiconductor layer, a semiconductor structure, a method for manufacturing a semiconductor structure, an active array substrate, and an indium gallium zinc oxide crystal. The crystallization method includes the following steps: forming an amorphous metal oxide semiconductor layer on a substrate; forming an oxide layer on the amorphous metal oxide semiconductor layer; forming an amorphous silicon layer on the oxide layer; and irradiating the amorphous silicon layer by using a laser, so as to heat the amorphous silicon layer, where the heated amorphous silicon layer heats the amorphous metal oxide semiconductor layer, so that the amorphous metal oxide semiconductor layer is converted into a crystallized metal oxide semiconductor layer.

8 Claims, 11 Drawing Sheets

(51) Int. Cl.
*H01L 29/04* (2006.01)
*H01L 21/02* (2006.01)
*H01L 29/66* (2006.01)

(52) U.S. Cl.
CPC ........ *H01L 27/124* (2013.01); *H01L 27/1214* (2013.01); *H01L 27/1225* (2013.01); *H01L 27/1251* (2013.01); *H01L 29/045* (2013.01); *H01L 29/66969* (2013.01); *H01L 29/7869* (2013.01); *H01L 29/78675* (2013.01); *H01L 27/1218* (2013.01)

(58) Field of Classification Search
CPC ........... H01L 27/1225; H01L 29/78675; H01L 29/045; H01L 29/7869; H01L 21/02565; H01L 27/1218; H01L 27/124; H01L 29/66969
See application file for complete search history.

(56) References Cited

U.S. PATENT DOCUMENTS

| | | | |
|---|---|---|---|
| 9,443,876 B2 | 9/2016 | Yamazaki et al. | |
| 9,577,111 B2 | 2/2017 | Ye | |
| 2006/0006391 A1* | 1/2006 | Matsumura | H01L 29/045 |
| | | | 257/72 |
| 2007/0072439 A1 | 3/2007 | Akimoto et al. | |
| 2011/0006297 A1* | 1/2011 | Inoue | H01L 21/02565 |
| | | | 257/43 |
| 2011/0062436 A1 | 3/2011 | Yamazaki et al. | |
| 2011/0084264 A1* | 4/2011 | Yamazaki | H01L 29/7869 |
| | | | 257/43 |
| 2011/0156024 A1 | 6/2011 | Koyama et al. | |
| 2013/0009147 A1 | 1/2013 | Koyama et al. | |
| 2013/0062601 A1 | 3/2013 | Yamazaki et al. | |
| 2014/0065804 A1 | 3/2014 | Tian et al. | |
| 2016/0086802 A1 | 3/2016 | Hong et al. | |
| 2016/0247831 A1* | 8/2016 | Makita | H01L 27/1225 |
| 2017/0033133 A1 | 2/2017 | Makita et al. | |

FOREIGN PATENT DOCUMENTS

| | | |
|---|---|---|
| CN | 103700665 A | 4/2014 |
| CN | 103928341 A | 7/2014 |
| CN | 104078621 A | 10/2014 |
| CN | 105612608 A | 5/2016 |

OTHER PUBLICATIONS

Office Action issued by State Intellectual Property Office of the Peoples Republic of China dated May 8, 2019 for Application No. 20171006136.0.

* cited by examiner

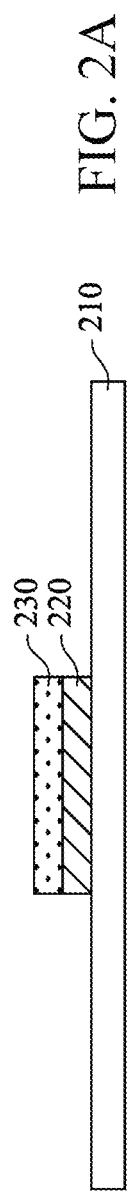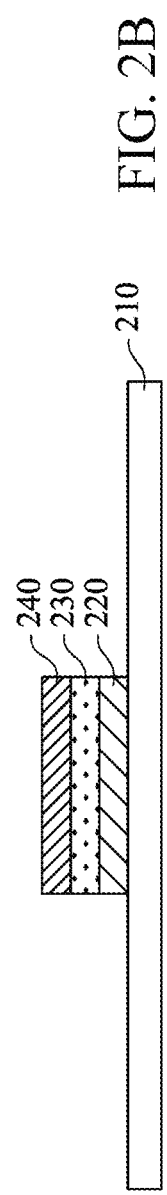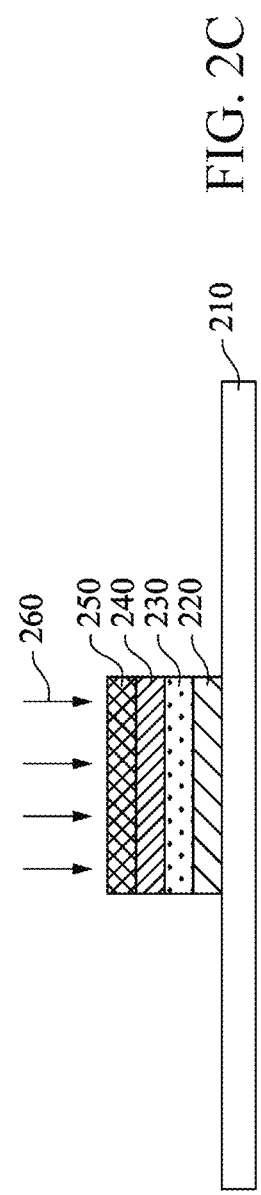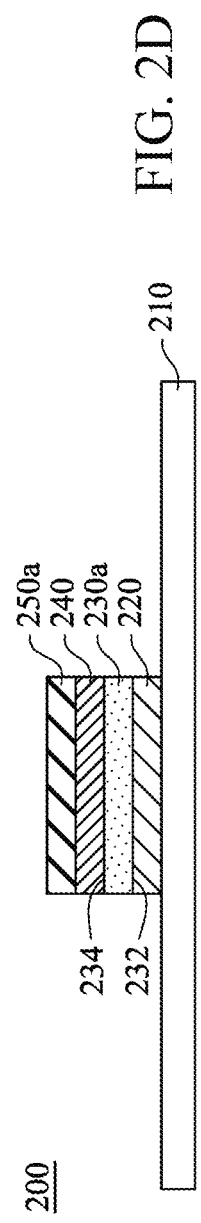

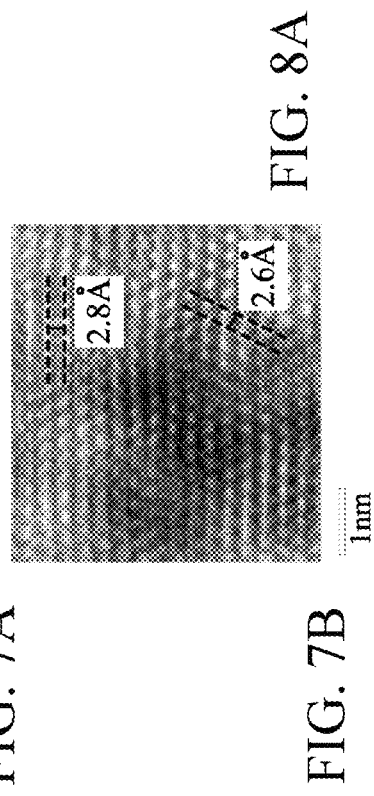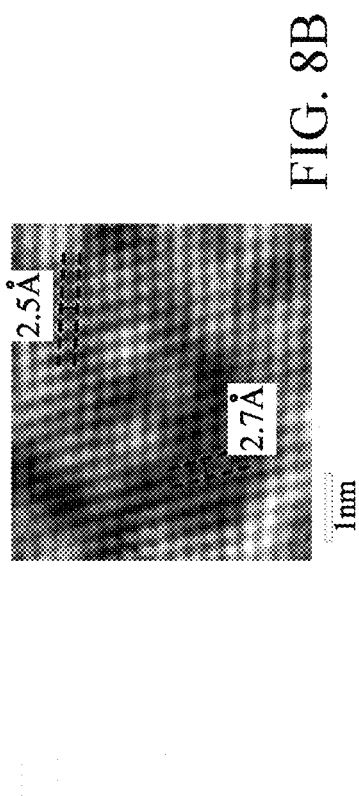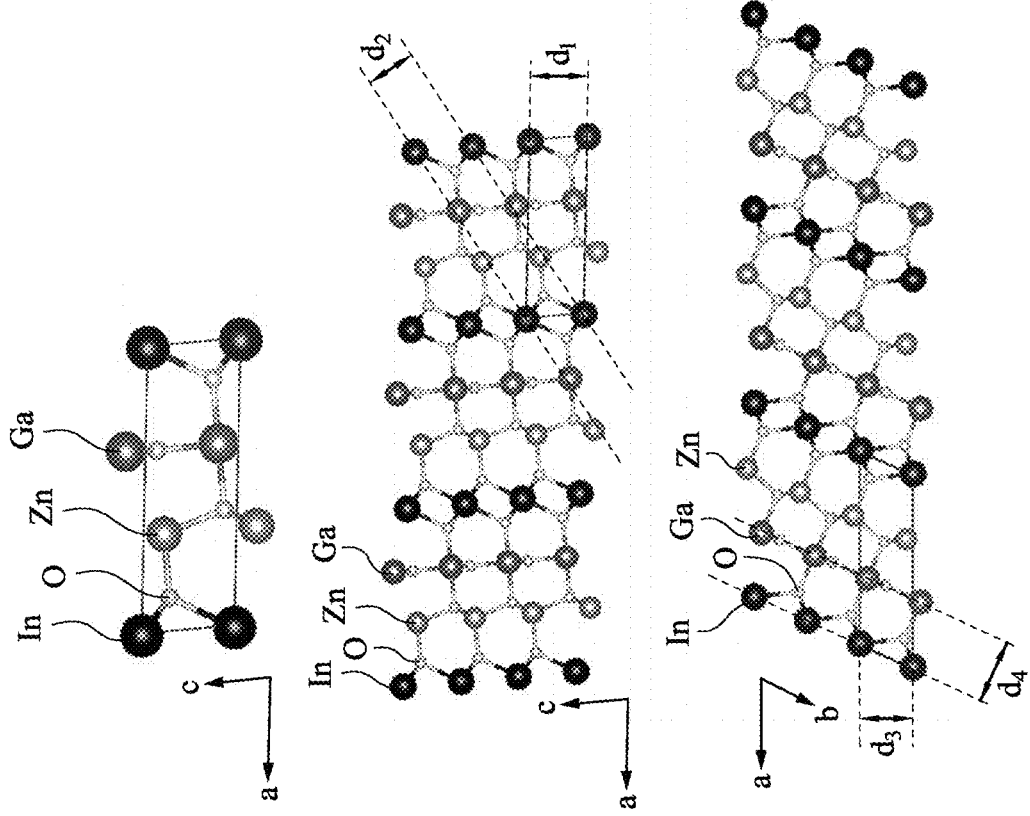

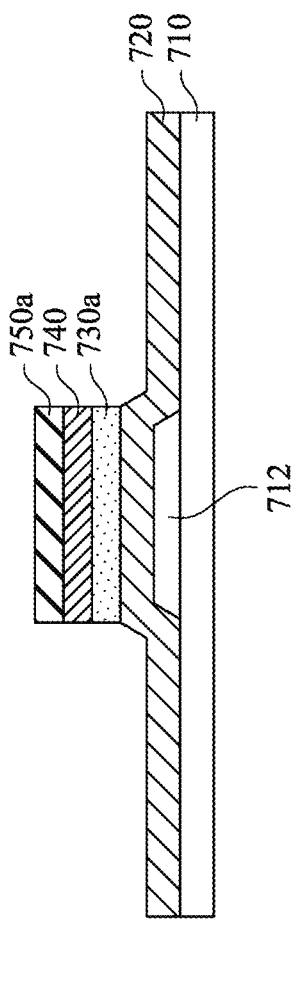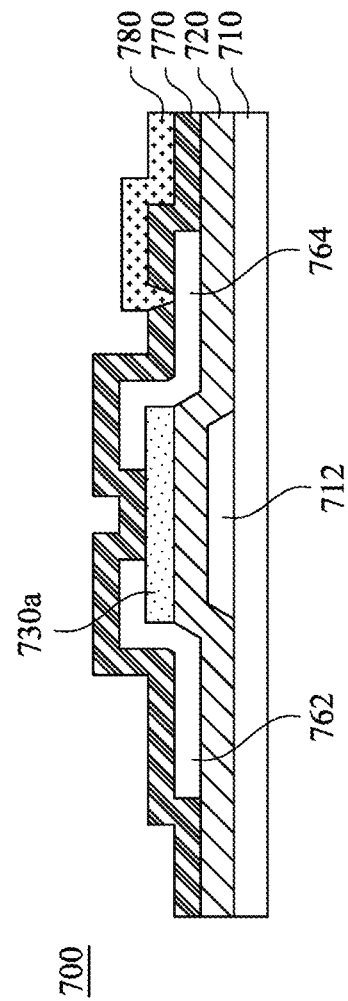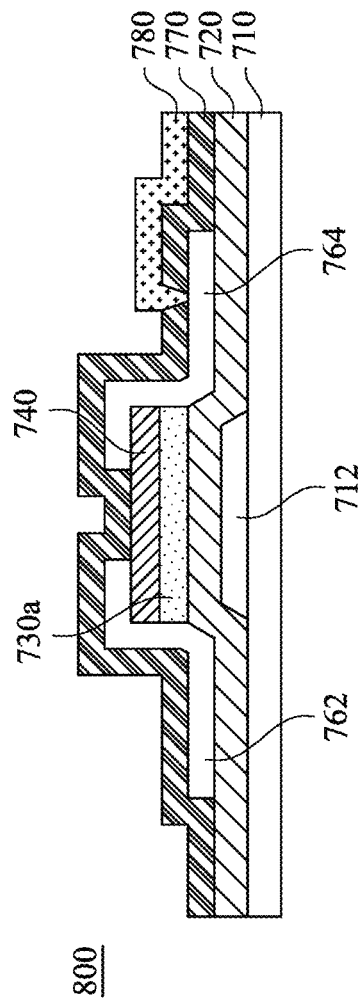

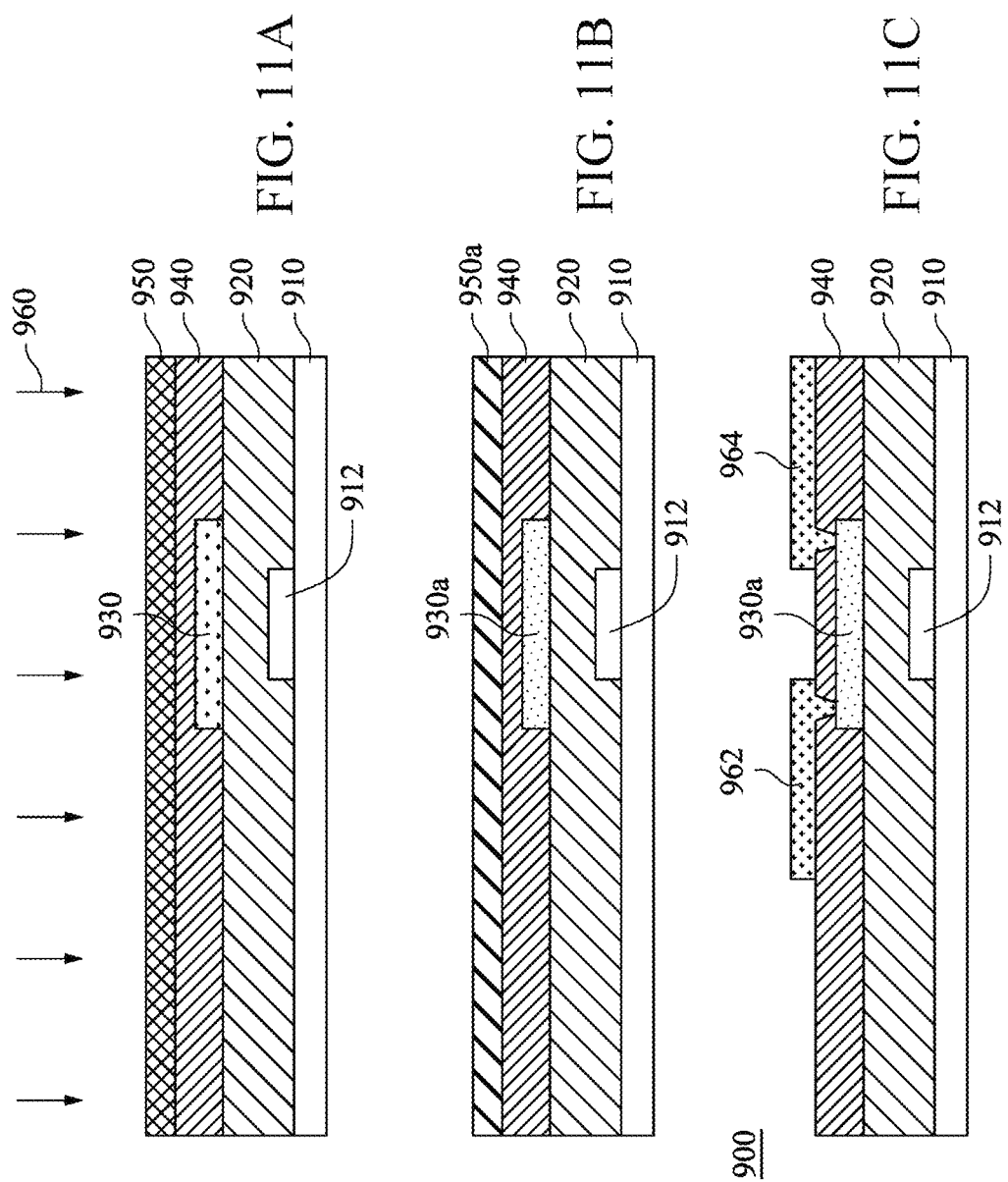

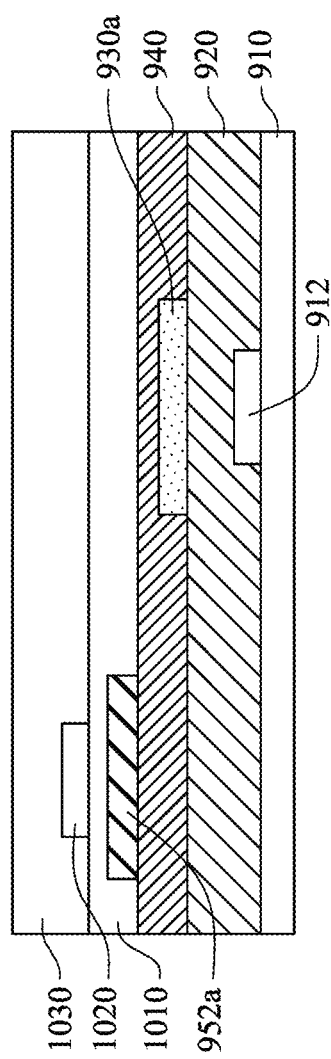
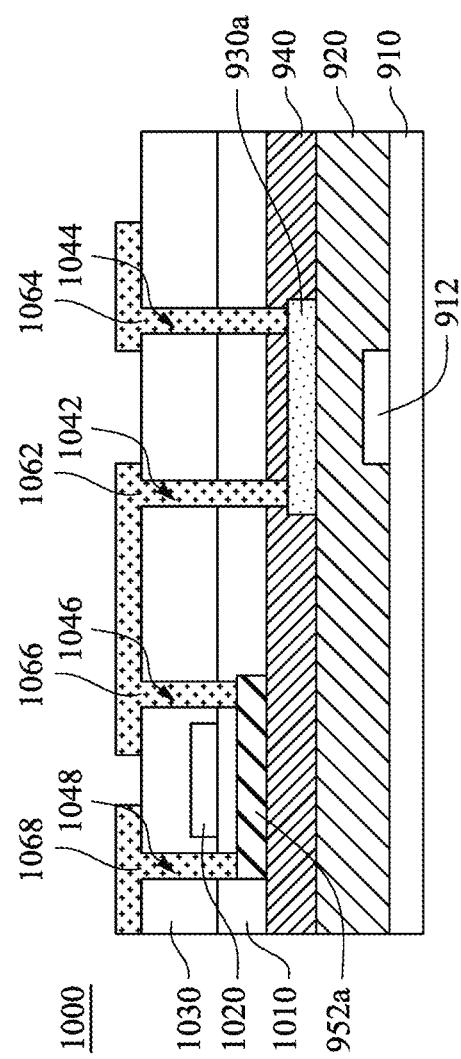

METHOD FOR CRYSTALLIZING METAL OXIDE SEMICONDUCTOR LAYER, SEMICONDUCTOR STRUCTURE, ACTIVE ARRAY SUBSTRATE, AND INDIUM GALLIUM ZINC OXIDE CRYSTAL

CROSS-REFERENCE TO RELATED PATENT APPLICATION

This non-provisional application claims priority to and the benefit of, pursuant to 35 U.S.C. § 119(a), patent application Serial No. 105141259 filed in Taiwan on Dec. 13, 2016. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a method for crystallizing a metal oxide semiconductor layer, a semiconductor structure, a method for manufacturing a semiconductor structure, an active array substrate, and an indium gallium zinc oxide crystal, and more particularly, to a method for crystallizing an amorphous metal oxide semiconductor layer by using a heated amorphous silicon layer as a heat source, and a semiconductor structure and an active array substrate that are formed by using this method.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, with the development of semiconductor manufacturing technologies, a process of a thin film transistor (TFT) becomes increasingly simple and fast, so that TFTs are widely applied to computer chips, mobile phone chips, TFT liquid crystal displays (LCD), and the like. A common method for manufacturing a TFT is back channel etch (BCE), which includes the following steps: first forming a metal layer covering an active layer, and then patterning the metal layer to form a source and a drain, where the step of patterning may be performed by using wet etching or dry etching. However, after an etchant removes the metal layer on the active layer, the active layer is highly vulnerable because of exposure to the etchant, causing a yield of TFTs to reduce.

In view of this, a method for manufacturing a TFT in which an active layer can resist corrosion by the etchant and a structure that is formed by using this method are needed.

SUMMARY

The present invention provides a method for crystallizing a metal oxide semiconductor layer, comprising the following steps: forming an amorphous metal oxide semiconductor layer on a substrate; forming a first oxide layer on the amorphous metal oxide semiconductor layer; forming an amorphous silicon layer on the first oxide layer; and irradiating the amorphous silicon layer by using a laser, so as to heat the amorphous silicon layer, wherein the heated amorphous silicon layer heats the amorphous metal oxide semiconductor layer, so that the amorphous metal oxide semiconductor layer is converted into a crystallized metal oxide semiconductor layer.

In an embodiment, before the forming an amorphous metal oxide semiconductor layer on a substrate, further comprising: forming a second oxide layer on the substrate, wherein the second oxide layer is sandwiched between the substrate and the amorphous metal oxide semiconductor layer.

In an embodiment, the laser is an excimer laser, a blue laser or a green laser.

In an embodiment, pulse energy of the laser is between approximately 70 mJ/cm$^2$ and approximately 600 mJ/cm$^2$.

In an embodiment, the irradiating the amorphous silicon layer by using a laser comprises: converting the heated amorphous silicon layer into a polycrystalline silicon layer.

In an embodiment, before the irradiating the amorphous silicon layer by using a laser, further comprising: processing the amorphous silicon layer by using rapid thermal processing (RTP).

The present invention provides a semiconductor structure, comprising: a substrate; a first gate, located on the substrate; a gate insulation layer, located on the first gate; a crystallized metal oxide semiconductor layer, located on the gate insulation layer; and a first source and a first drain, located on the crystallized metal oxide semiconductor layer, wherein the crystallized metal oxide semiconductor layer comprises a plurality of metal oxide semiconductor grains, each of the metal oxide semiconductor grains has a crystallographic axis, and the crystallographic axes are approximately parallel to each other.

In an embodiment, the crystallographic axis is approximately perpendicular to a surface of the crystallized metal oxide semiconductor layer.

In an embodiment, each metal oxide semiconductor grain has a layer-form structure, and a layer surface of the layer-form structure is approximately parallel to a surface of the crystallized metal oxide semiconductor layer.

In an embodiment, the crystallized metal oxide semiconductor layer comprises indium gallium zinc oxide, indium tin zinc oxide, hafnium indium zinc oxide or indium zinc oxide.

In an embodiment, a size of each metal oxide semiconductor grain is between approximately 1 nanometer and approximately 5.5 nanometers.

In an embodiment, the crystallized metal oxide semiconductor layer is in a fully-crystalline state.

In an embodiment, an included angle between the crystallographic axis and a normal of the surface is between 0 degree and 7 degrees.

In an embodiment, the semiconductor structure further comprises an oxide layer, located between the crystallized metal oxide semiconductor layer and the first source and the first drain.

In an embodiment, the semiconductor structure further comprises an oxide layer, located on the gate insulation layer and the crystallized metal oxide semiconductor layer, wherein the first source and the first drain penetrate the oxide layer to contact the crystallized metal oxide semiconductor layer.

In an embodiment, the semiconductor structure further comprises: an oxide layer, located on the gate insulation layer and the crystallized metal oxide semiconductor layer; a patterned polycrystalline silicon layer, located on the oxide layer; a first dielectric layer, located on the patterned polycrystalline silicon layer; a second gate, located on the first dielectric layer; a second dielectric layer, located on the second gate; a second source, located on the second dielectric layer, and penetrating the first dielectric layer and the second dielectric layer to contact the patterned polycrystalline silicon layer; and a second drain, located on the second dielectric layer, and penetrating the first dielectric layer and the second dielectric layer to contact the patterned polycrystalline silicon layer, wherein the first source is located on the second dielectric layer, and penetrates the oxide layer, the first dielectric layer, and the second dielectric layer to contact the crystallized metal oxide semiconductor layer, the first drain penetrates the oxide layer, the first dielectric layer, and the second dielectric layer to contact the crystallized metal oxide semiconductor layer, and the first source is equipotentially connected to the second source.

In an embodiment, the semiconductor structure further comprises: an oxide layer, located on the gate insulation layer and the crystallized metal oxide semiconductor layer; a patterned polycrystalline silicon layer, located on the oxide layer; a second gate, located between the substrate and a gate insulation layer, and overlapping the patterned polycrystalline silicon layer; a first dielectric layer, located on the patterned polycrystalline silicon layer; a second dielectric layer, located on the first dielectric layer; a second source, located on the second dielectric layer, and penetrating the first dielectric layer and the second dielectric layer to contact the patterned polycrystalline silicon layer; and a second drain, located on the second dielectric layer, and penetrating the first dielectric layer and the second dielectric layer to contact the patterned polycrystalline silicon layer, wherein the first source is located on the second dielectric layer, and penetrates the oxide layer, the first dielectric layer, and the second dielectric layer to contact the crystallized metal oxide semiconductor layer, the first drain penetrates the oxide layer, the first dielectric layer, and the second dielectric layer to contact the crystallized metal oxide semiconductor layer, and the first source is equipotentially connected to the second source.

The present invention provides a semiconductor structure, comprising: a substrate; a crystallized metal oxide semiconductor layer, located on the substrate, comprising a plurality of metal oxide semiconductor grains, each of the metal oxide semiconductor grains having a crystallographic axis, and the crystallographic axes being approximately parallel to each other; an oxide layer, located on the crystallized metal oxide semiconductor layer; a patterned polycrystalline silicon layer, located on the oxide layer; a first dielectric layer, located on the patterned polycrystalline silicon layer; a first gate, located on the first dielectric layer; a second gate, located on the first dielectric layer; a second dielectric layer, located on the first gate and the second gate; a first source, located on the second dielectric layer, and penetrating the oxide layer, the first dielectric layer, and the second dielectric layer to contact the crystallized metal oxide semiconductor layer; a first drain, located on the second dielectric layer, and penetrating the oxide layer, the first dielectric layer, and the second dielectric layer to contact the crystallized metal oxide semiconductor layer; a second source, penetrating the first dielectric layer and the second dielectric layer to contact the patterned polycrystalline silicon layer, and the second source being equipotentially connected to the first source; and a second drain, located on the second dielectric layer, and penetrating the first dielectric layer and the second dielectric layer to contact the patterned polycrystalline silicon layer.

The present invention provides an active array substrate, comprising: a display area; a peripheral area, surrounding the display area; at least one pixel structure, located inside the display area, and comprising a crystallized metal oxide semiconductor transistor; and a gate driving circuit, located inside the peripheral area, and comprising a polycrystalline silicon transistor.

In an embodiment, the crystallized metal oxide semiconductor transistor comprises: a substrate; a gate, located on the substrate; a gate insulation layer, located on the gate; a crystallized metal oxide semiconductor layer, located on the gate insulation layer; and a source and a drain, located on the crystallized metal oxide semiconductor layer, wherein the crystallized metal oxide semiconductor layer comprises a plurality of metal oxide semiconductor grains, each of the metal oxide semiconductor grains has a crystallographic axis, and the crystallographic axes are approximately parallel to each other.

In an embodiment, the polycrystalline silicon transistor comprises: a patterned polycrystalline silicon layer; a first dielectric layer, located on the patterned polycrystalline silicon layer; a gate, located on the first dielectric layer; a second dielectric layer, located on the gate; a source, located on the second dielectric layer, and penetrating the first dielectric layer and the second dielectric layer to contact the patterned polycrystalline silicon layer; and a drain, located on the second dielectric layer, and penetrating the first dielectric layer and the second dielectric layer to contact the patterned polycrystalline silicon layer.

The present invention provides a method for manufacturing a semiconductor structure, comprising: receiving a base material; forming an amorphous metal oxide semiconductor layer on the base material; forming an oxide layer on the amorphous metal oxide semiconductor layer; forming an amorphous silicon layer on the oxide layer; irradiating the amorphous silicon layer by using a laser, so as to heat the amorphous silicon layer, wherein the heated amorphous silicon layer heats the amorphous metal oxide semiconductor layer, so that the amorphous metal oxide semiconductor layer is converted into a crystallized metal oxide semiconductor layer, and the heated amorphous silicon layer is converted into a polycrystalline silicon layer; patterning the polycrystalline silicon layer, to form a patterned polycrystalline silicon layer; and forming a common electrode, connecting the patterned polycrystalline silicon layer and the crystallized metal oxide semiconductor layer.

In an embodiment, before the forming a common electrode, the method further comprises the following steps: forming a first dielectric layer on the patterned polycrystalline silicon layer; forming a first gate on the first dielectric layer; forming a second dielectric layer on the first gate; and forming a first opening, a second opening, a third opening, and a fourth opening, wherein the first opening and the second opening penetrate the first dielectric layer and the second dielectric layer, to expose the patterned polycrystalline silicon layer, and the third opening and the fourth opening penetrate the oxide layer, the first dielectric layer, and the second dielectric layer, to expose the crystallized metal oxide semiconductor layer.

In an embodiment, the forming a common electrode comprises: forming a first source in the first opening, a first drain in the second opening, a second source in the third opening, and a second drain in the fourth opening, wherein the first source is equipotentially connected to the second source, so as to form the common electrode.

In an embodiment, the base material comprises: a substrate; a gate, located on the substrate, overlapping the crystallized metal oxide semiconductor layer; and a gate insulation layer, located on the gate.

In an embodiment, the base material comprises: a substrate; a gate, located on the substrate, overlapping the patterned polycrystalline silicon layer; and a gate insulation layer, located on the gate.

In an embodiment, before the forming the second dielectric layer on the first dielectric layer, the method further comprises: forming a second gate on the first dielectric layer, the second gate overlapping the crystallized metal oxide semiconductor layer.

The present invention provides an indium gallium zinc oxide crystal, a chemical formula of the indium gallium zinc oxide crystal is $InGaZnO_4$, wherein the indium gallium zinc oxide crystal belongs to a triclinic crystal system, a space group is P1, Z=1, a lattice constant a is within a range between 9.98 Å and 10.18 Å, a lattice constant b is within a range between 3.199 Å and 3.399 Å, a lattice constant c is within a range between 3.199 Å and 3.399 Å, a crystal axis included angle α is within a range between 59.00° and 61.00°, a crystal axis included angle β is within a range between 69.84° and 71.84°, and a crystal axis included angle γ is within a range between 59.51° and 61.51°.

These and other features, aspects, and advantages of the present invention become more comprehensible with reference to the following description and the appended claims.

It should be understood that the foregoing general description and the following specific description are merely exemplary and explanatory, and are intended to provide required further description of the present invention.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 2A to FIG. 2D are schematic sectional diagrams of a semiconductor structure 200 in various stages of a process according to an embodiment of the present invention;

FIG. 3 is a scanning electron microscope (SEM) image of a top view of a crystallized metal oxide semiconductor layer 230a;

FIG. 5A, FIG. 5B, and FIG. 5C are respectively HRTEM images of an upper layer, a middle layer, and a lower layer of the crystallized metal oxide semiconductor layer 230a;

FIG. 7A is a side view of a unit cell of indium gallium zinc oxide according to the present invention;

FIG. 7B is a side view of an indium gallium zinc oxide crystal obtained through theoretical calculation;

FIG. 7C is a top view of the indium gallium zinc oxide crystal obtained through theoretical calculation;

FIG. 8A is an image obtained after IFFT processing is performed on the HRTEM image of the side view of the crystallized metal oxide semiconductor layer 230a in FIG. 4;

FIG. 8B is an image obtained after IFFT processing is performed on the HRTEM image of the top view of the crystallized metal oxide semiconductor layer 230a in FIG. 4;

FIG. 9A and FIG. 9B are schematic sectional diagrams of a semiconductor structure 700 in various stages of a process according to an embodiment of the present invention;

FIG. 10 is a schematic sectional diagram of a semiconductor structure 800 according to an embodiment of the present invention;

FIG. 11A to FIG. 11C are schematic sectional diagrams of a semiconductor structure 900 in various stages of a process according to an embodiment of the present invention;

FIG. 12A and FIG. 12B are schematic sectional diagrams of a semiconductor structure 1000 in various stages of a process according to an embodiment of the present invention;

DETAILED DESCRIPTION

Figure 1:
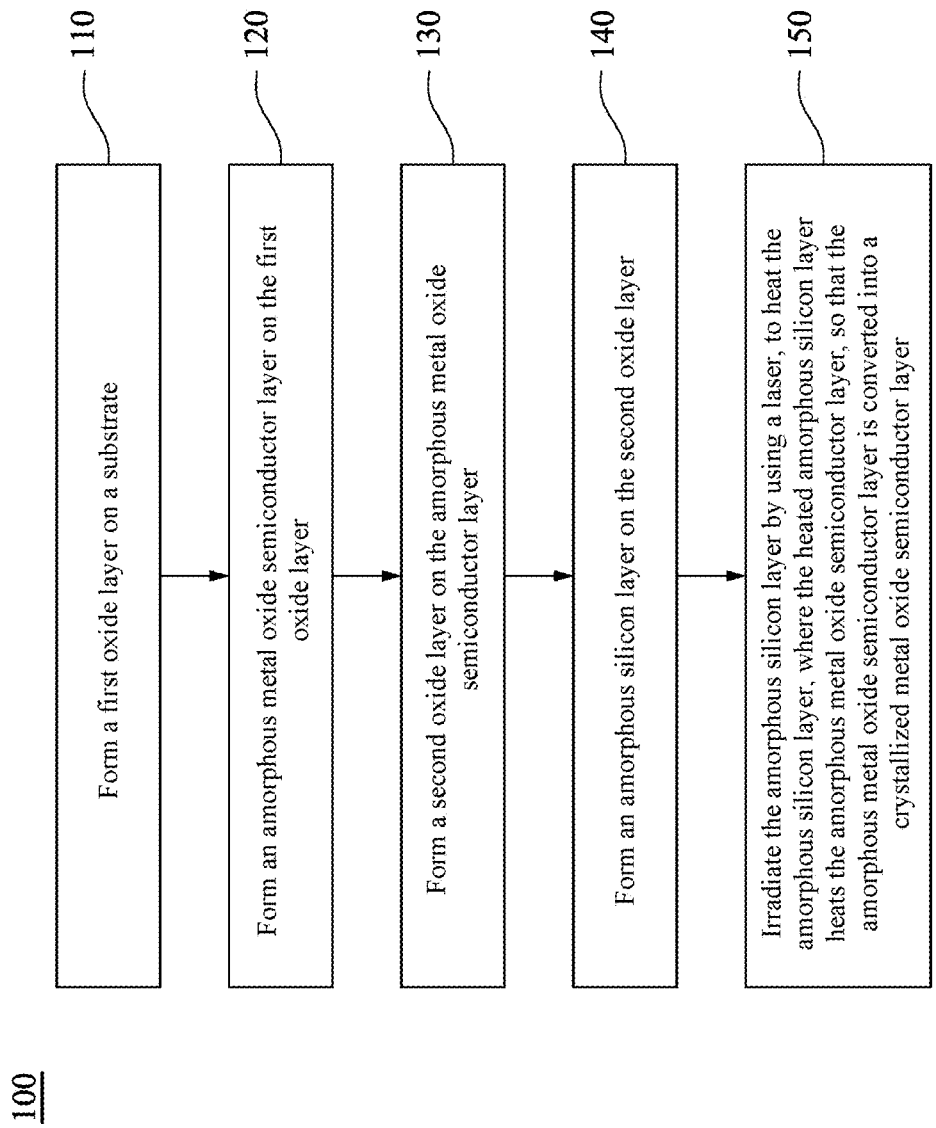
FIG. 1 shows a method 100 for crystallizing a metal oxide semiconductor layer according to an embodiment of the present invention.

The objectives and advantages of the present invention will become clearer through the detailed description in the following embodiments with reference to the accompanying drawings and reference numerals.

To make the description of the present disclosure more specific and thorough, reference may be made to the accompanying drawings and the following various embodiments. Same numbers in the accompanying drawings represent same or similar elements, and for clear description, and sizes or thickness of elements may be shown in an exaggerated manner and are not drawn according to original sizes. In addition, to simplify the accompanying drawings, some structures and components are shown in a simple schematic manner in the accompanying drawings. However, it should be understood that the provided embodiments are not used to limit the scope of the present invention. These details in practice should not be used to limit the present invention. That is, in some of the embodiments of the present invention, these details in practice are not essential.

Herein, it may be understood that words such as first, second, and third are used to describe various elements, components, areas, layers and/or blocks. However, these elements, components, areas, layers and/or blocks should not be limited by these terms. These words are only used for distinguishing between single elements, components, areas, layers and/or blocks. Therefore, a first element, component, area, layer and/or block hereinafter may also be referred to as a second element, component, area, layer and/or block without departing from the concept of the present invention.

The present invention provides a method for crystallizing a metal oxide semiconductor layer. Refer to FIG. 1 and FIG. 2A to FIG. 2D at the same time. FIG. 1 shows a method 100 for crystallizing a metal oxide semiconductor layer according to an embodiment of the present invention. The crystallization method 100 includes an operation 110, an operation 120, an operation 130, an operation 140, and an operation 150. FIG. 2A to FIG. 2D are schematic sectional diagrams of a semiconductor structure 200 in various stages of a process according to an embodiment of the present invention. Although the method disclosed herein is described below by using a series of operations or steps, an order of these operations or steps should not be construed as a limitation to the present invention. For example, some operations or steps may be performed according to a different order and/or may be performed at the same time as another step. In addition, all operations, steps and/or features do not require to be executed to implement the embodiments of the present invention. In addition, each operation or step discussed herein may include a plurality of sub-steps or actions.

In the operation 110, as shown in FIG. 2A, a first oxide layer 220 is formed on a substrate 210. In an embodiment, the substrate 210 is a glass substrate. However, in some embodiments, a plastic substrate such as a polyimide (PI) substrate, a poly(ethylene naphthalate) (PEN) substrate or a polyester (PES) substrate may also be used as the substrate 210. In the operation 120, as shown in FIG. 2A, an amorphous metal oxide semiconductor layer 230 is formed on the first oxide layer 220. In the operation 130, as shown in FIG. 2B, a insulating layer 240 is formed on the amorphous metal oxide semiconductor layer 230. In the operation 140, as shown in FIG. 2C, an amorphous silicon layer 250 is formed on the insulating layer 240. In an embodiment, the first oxide layer 220 and the insulating layer 240 are independently a silicon oxide ($SiO_x$) layer, a tantalum pentoxide ($Ta_2O_5$) layer, an aluminum oxide ($Al_2O_3$) layer, a zirconium oxide ($ZrO_2$) layer or a combination thereof.

In an embodiment, the first oxide layer 220 may be formed on the substrate 210 by using sputtering, spin-on, chemical vapor deposition (CVD), atomic layer deposition (ALD), low pressure CVD (LPCVD) or physical vapor deposition (PVD). Refer to the foregoing manner to form the amorphous metal oxide semiconductor layer 230 and the insulating layer 240. Sputtering can be performed at a relatively low temperature, and operations are relatively simple.

In the operation 150, as shown in FIG. 2C, the amorphous silicon layer 250 is irradiated by using a laser 260. The amorphous silicon layer 250 absorbs the laser 260 and the temperature of the amorphous silicon layer 250 rises. Thermal energy of the heated amorphous silicon layer 250 passes through the insulating layer 240 and heats the amorphous metal oxide semiconductor layer 230, so that atoms inside the amorphous metal oxide semiconductor layer 230 are rearranged to form a crystal, and the amorphous metal oxide semiconductor layer 230 is converted into a crystallized metal oxide semiconductor layer 230a shown in FIG. 2D. In other words, after being irradiated by using the laser 260, the heated amorphous silicon layer 250 can be used as a heat source for heating the amorphous metal oxide semiconductor layer 230. Moreover, when the amorphous silicon layer 250 is being irradiated by using the laser 260, atoms inside the heated amorphous silicon layer 250 are rearranged, and the heated amorphous silicon layer 250 is converted into a polycrystalline silicon layer 250a. It should be particularly noted that in the present invention, the insulating layer 240 is disposed between the amorphous silicon layer 250 and the amorphous metal oxide semiconductor layer 230, and the insulating layer 240 is not easy to be heated to cause peeling to occur. In some embodiments, a nitride layer may also be used to replace the insulating layer 240. However, when the operation 150 is performed, interfaces between the insulating layer 240 and the amorphous silicon layer 250 and the amorphous metal oxide semiconductor layer 230 need to be process more carefully to avoid a peeling problem. In addition, because in the embodiment, the amorphous metal oxide semiconductor layer 230 is heated by using the heated amorphous silicon layer 250, the substrate 210 is less affected.

In an embodiment in FIG. 2C, the amorphous metal oxide semiconductor layer 230 is sandwiched between the first oxide layer 220 and the insulating layer 240. Therefore, when heat reaches the amorphous metal oxide semiconductor layer 230, the first oxide layer 220 may be used as a heat insulating layer, to keep heat from easy dissipation, which helps form the crystallized metal oxide semiconductor layer 230a.

In an embodiment, the operation 110 may be omitted, and the amorphous metal oxide semiconductor layer 230 is directly formed on the substrate 210. The subsequent operations 130 to 150 are then performed.

In an embodiment, the laser 260 may be an excimer laser, a blue laser or a green laser. A laser 260 whose wavelength approximates to an absorption wavelength of amorphous silicon is chosen, so that amorphous silicon can be heated more effectively. The absorption wavelength of amorphous silicon is approximately between 350 nm and 750 nm. If an excimer laser is chosen to irradiate the amorphous silicon layer, that is, an excimer laser annealing (ELA) process is used to process the amorphous silicon layer, in an embodiment, pulse energy of the laser 260 is between approximately 70 $mJ/cm^2$ and approximately 600 $mJ/cm^2$. In an embodiment, before the amorphous silicon layer 250 is irradiated by using the laser 260, the method further includes: processing the amorphous silicon layer 250 by using RTP, so as to prevent hydrogen explosion from occurring.

In an embodiment, the amorphous metal oxide semiconductor layer 230 may include an indium gallium zinc oxide layer, an indium tin zinc oxide layer, a hafnium indium zinc oxide layer or an indium zinc oxide layer. Therefore, according to a different amorphous metal oxide semiconductor layer 230 that is used, the crystallized metal oxide semiconductor layer 230a also includes an indium gallium zinc oxide layer, an indium tin zinc oxide layer, a hafnium indium zinc oxide layer or an indium zinc oxide layer. It should be particularly noted that the crystallized metal oxide semiconductor layer 230a has a characteristic of resisting corrosion of an acidic etchant, for example, has a characteristic of resisting aluminic acid, hydrofluoric acid or oxalic acid.

In an embodiment, the crystallized metal oxide semiconductor layer 230a includes a plurality of metal oxide semiconductor grains, each of the metal oxide semiconductor grains has a crystallographic axis, and the crystallographic axis is approximately perpendicular to an upper surface 234 of the crystallized metal oxide semiconductor layer, or the crystallographic axis is approximately perpendicular to a lower surface 232 of the crystallized metal oxide semiconductor layer. In an embodiment of the present invention, the laser 260 irradiates the amorphous silicon layer 250 in a direction nearly perpendicular to the upper surface 234 or the lower surface 232. Therefore, the conduction of heat is from top to bottom. Therefore, a metal oxide semiconductor also crystallizes in this conduction direction. In other words, the crystallographic axis of the metal oxide semiconductor grain is approximately parallel to an irradiation direction of the laser 260. Therefore, it may be known that because different positions of an amorphous metal oxide semiconductor layer are all irradiated by a laser in a same direction, the crystallographic axes of the metal oxide semiconductor grains inside the crystallized metal oxide semiconductor layer are approximately parallel to each other.

In addition, because the amorphous silicon layer 250 is irradiated at different times by using multiple lasers 260. Therefore, the heat generated in each time of irradiation crystallizes a portion of the amorphous metal oxide semiconductor layer 230. After continuous irradiation of the multiple lasers 260, multiple metal oxide semiconductor grains are formed. In an embodiment, sufficient lasers 260 are provided, so that the entire amorphous metal oxide semiconductor layer 230 can be crystallized, so as to form the crystallized metal oxide semiconductor layer 230a in a fully-crystalline state. In other words, the crystallized metal oxide semiconductor layer 230a in a fully-crystalline state is formed of the multiple metal oxide semiconductor grains. It may be known that the crystallized metal oxide semiconductor layer 230a is polycrystalline. According to an embodiment of the present invention, each of a plurality of metal oxide semiconductor grains of the crystallized metal oxide semiconductor layer 230a has a crystallographic axis, and the crystallographic axes are approximately parallel to each other.

Figure 6C:
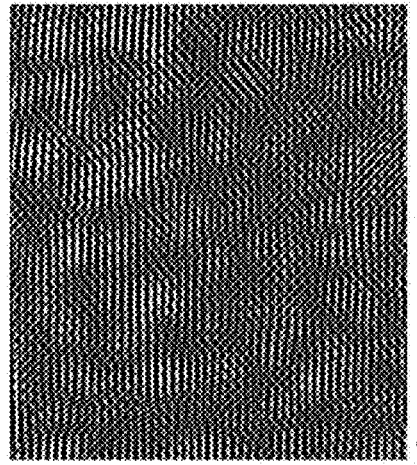
FIG. 6A, FIG. 6B, and FIG. 6C are respectively images obtained after Inverse Fast Fourier Transform (IFFT) processing are performed on FIG. 5A, FIG. 5B, and FIG. 5C.
Figure 6B:
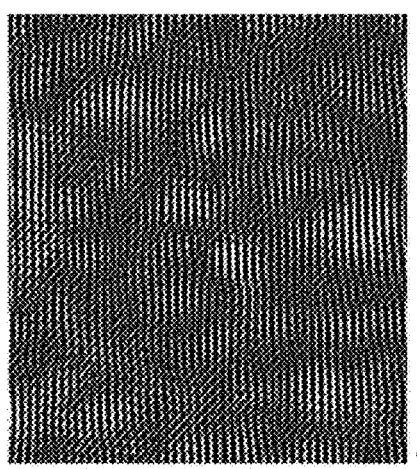
Figure 6A:
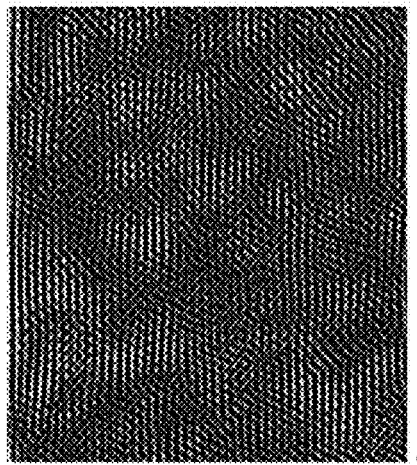

In FIG. 2C, the laser 260 irradiates the amorphous silicon layer 250 in a direction nearly perpendicular to the upper surface 234 or the lower surface 232. Each metal oxide semiconductor grain has a layer-form structure. A layer surface of the layer-form structure is approximately parallel to the upper surface 234 or the lower surface 232 of the crystallized metal oxide semiconductor layer. Refer to the description of subsequent FIG. 6A to FIG. 6C for details of the layer-form structure.

In an embodiment, the laser 260 irradiates the amorphous silicon layer 250 in a direction nearly perpendicular to the upper surface 234, and an included angle between the crystallographic axis of each metal oxide semiconductor grain and a normal of the upper surface 234 is between 0 degree and 7 degrees. In an embodiment, a size of each metal oxide semiconductor grain is between approximately 1 nanometer and approximately 5.5 nanometers.

In an embodiment, the material of the amorphous metal oxide semiconductor layer 230 is chosen to be indium gallium zinc oxide ($InGaZnO_4$), where a molar ratio of indium:gallium:zinc:oxygen is 1:1:1:4. The crystallized metal oxide semiconductor layer 230a is formed by using the crystallization method 100. According to an X-ray diffraction (XRD) graph (not shown) of the crystallized metal oxide semiconductor layer 230a, a relatively strong signal may be observed when an angle of scattering 2θ is between 30 degrees and 40 degrees, representing that an indium gallium zinc oxide ($InGaZnO_4$) crystal is formed. Etch resistance of the crystallized metal oxide semiconductor layer 230a to aluminic acid, hydrofluoric acid and oxalic acid is further tested. Aluminic acid is formed by mixing nitric acid, phosphoric acid and acetic acid. An etch rate of etching the crystallized metal oxide semiconductor layer 230a by aluminic acid is approximately 7.62 angstrom/second. However, an etch rate of etching the amorphous metal oxide semiconductor layer 230 by aluminic acid is greater than 80 angstrom/second. An etch rate of etching the crystallized metal oxide semiconductor layer 230a by hydrofluoric acid is approximately 9.9 angstrom/second, and an etch rate of etching the amorphous metal oxide semiconductor layer 230 by hydrofluoric acid is greater than 120 angstrom/second. An etch rate of etching the crystallized metal oxide semiconductor layer 230a by oxalic acid is approximately 1.24 angstrom/second, and an etch rate of etching the amorphous metal oxide semiconductor layer 230 by oxalic acid is approximately 5.7 angstrom/second. It may be proven by using the foregoing experimental results that the method for crystallizing a metal oxide semiconductor layer of the present embodiment can be used to generate a crystallized metal oxide semiconductor layer that has a characteristic of resisting corrosion of aluminic acid, hydrofluoric acid, and oxalic acid. More specifically, because atoms in the crystallized metal oxide semiconductor layer are arranged neatly and there are relatively few vacancies, these etchants do not easily enter the structure, so that the crystallized metal oxide semiconductor layer has a desirable corrosion-resistant characteristic.

Figure 4:
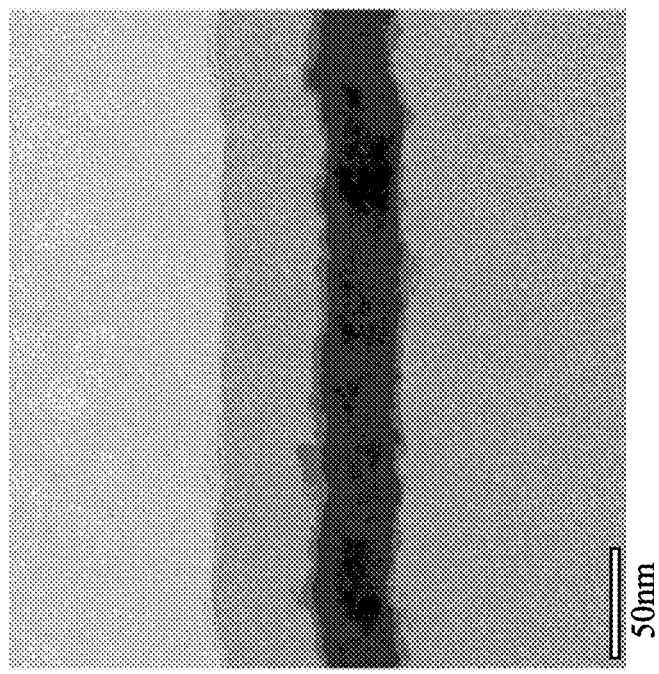
FIG. 4 is a high-resolution transmission electron microscope (HRTEM) image of the semiconductor structure 200.
Figure 3:
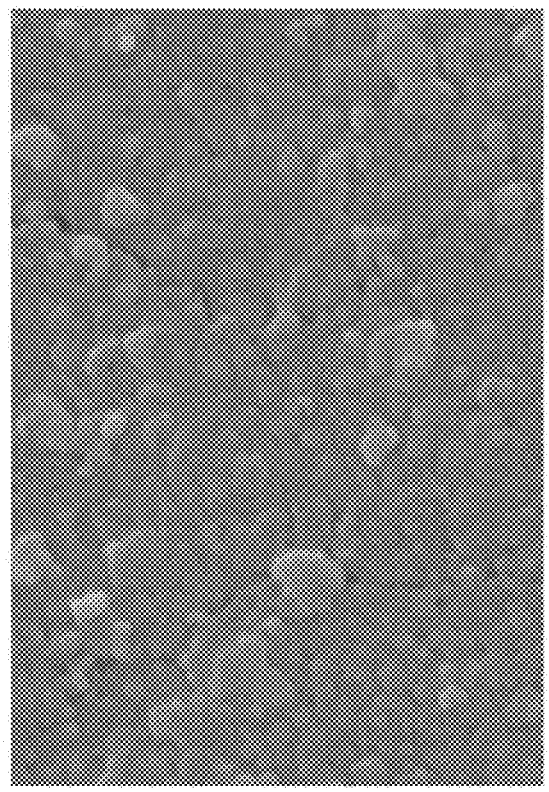

Referring to FIG. 3, FIG. 3 is a SEM image of a top view of the crystallized metal oxide semiconductor layer 230a. The crystallized metal oxide semiconductor layer 230a in a fully-crystalline state has an uneven surface, and generation of crystal particles may be observed. Referring to FIG. 4, FIG. 4 is an HRTEM image of the semiconductor structure 200. A layer having the darkest color is the crystallized metal oxide semiconductor layer 230a, a thickness of which is approximately 40 nm. An upper layer and a lower layer of the crystallized metal oxide semiconductor layer 230a are respectively the insulating layer 240 and the first oxide layer 220.

Figure 5C:
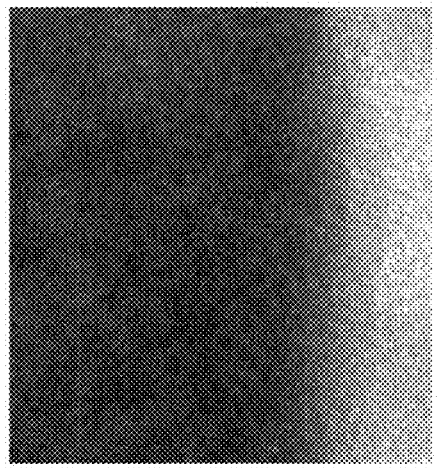
Figure 5B:
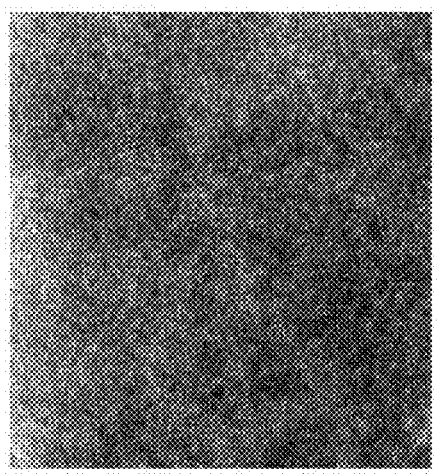
Figure 5A:
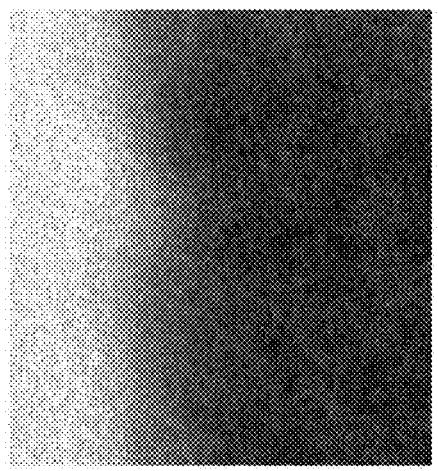

FIG. 5A, FIG. 5B, and FIG. 5C are respectively HRTEM images of an upper portion, a middle portion, and a lower portion of the crystallized metal oxide semiconductor layer 230a in FIG. 4, and after IFFT processing of FIG. 5A, FIG. 5B, and FIG. 5C, FIG. 6A, FIG. 6B, and FIG. 6C are obtained. A distinct crystal boundary may be observed in all FIG. 6A, FIG. 6B, and FIG. 6C. It may be known that multiple metal oxide semiconductor grains are actually included inside the crystallized metal oxide semiconductor layer 230a. Moreover, because the laser 260 irradiates the amorphous silicon layer 250 in a direction nearly perpendicular to the upper surface 234, so as to heat the amorphous metal oxide semiconductor layer 230, to form the crystallized metal oxide semiconductor layer 230a, each metal oxide semiconductor grain has a layer-form structure shown in FIG. 6A, FIG. 6B, and FIG. 6C, and a layer surface of the layer-form structure is approximately parallel to the upper surface 234 of the crystallized metal oxide semiconductor layer 230a. It may also be regarded that each of the metal oxide semiconductor grains has a crystallographic axis, and the crystallographic axes are approximately parallel to each other. Moreover, because a crystallization form is present in all FIG. 6A, FIG. 6B, and FIG. 6C, it is proven that the crystallized metal oxide semiconductor layer 230a in a fully-crystalline state can actually be formed by using the crystallization method 100. In addition, distinct diffraction points are present in nano-beam electron diffraction (NBED) images (not shown) of the upper portion, the middle portion, and the lower portion of the crystallized metal oxide semiconductor layer 230a. It may also be proven that crystallization occurs in the upper portion, the middle portion, and the lower portion.

Subsequently, in the embodiment, the structure of a metal oxide semiconductor grain is further analyzed by using a manner of theoretical calculation. First, a unit cell of indium gallium zinc oxide is established. FIG. 7A is a side view of the unit cell of indium gallium zinc oxide disclosed in the embodiment. Software used to draw the unit cell in FIG. 7A is VESTA (K. Momma and F. Izumi, "VESTA 3 for three-dimensional visualization of crystal, volumetric and morphology data," J. Appl. Crystallogr., 44, 1272-1276 (2011).). A simulation result after convergence of an indium gallium zinc oxide crystal established by using this unit cell may then be obtained by using a manner of theoretical calculation. Finally, comparison with experimental results is then performed.

A chemical formula of the indium gallium zinc oxide crystal disclosed in the present embodiment is InGaZnO$_4$. The indium gallium zinc oxide crystal belongs to a triclinic crystal system, a space group is P1, and a quantity of molecules contained in the unit cell is Z=1. A lattice constant a is within a range between 9.98 Å and 10.18 Å, a lattice constant b is within a range between 3.199 Å and 3.399 Å, and a lattice constant c is within a range between 3.199 Å and 3.399 Å. A crystal axis included angle between the lattice constants b and c is α, and α is within a range between 59.00° and 61.00°. A crystal axis included angle between the lattice constants a and c is β, and β is within a range between 69.84° and 71.84°. A crystal axis included angle between the lattice constants a and b is γ, and γ is within a range between 59.51° and 61.51°. In an embodiment, the lattice constant a is 10.08 Å, the lattice constant b is 3.299 Å, and the lattice constant c is 3.299 Å. The crystal axis included angle α between the lattice constants b and c is 60.00°, the crystal axis included angle β between the lattice constants a and c is 70.84°, and the crystal axis included angle γ between the lattice constants a and b is 60.51°.

A result after convergence of the indium gallium zinc oxide crystal established by using the unit cell of the present embodiment may be obtained through electronic structure calculation. In the electronic structure calculation, a density functional theory, a pseudo-potential approximation method, and a projector augmented-wave (PAW) method are adopted. Simulation software is Quantum ESPRESSO (P. Giannozzi, et. al (2009), "QUANTUM ESPRESSO: a modular and open-source software project for quantum simulations of materials," Journal of Physics; Condensed Matter, 39, 395502; www.quantum-espresso.org.). Kinetic energy cutoff for wave functions is 50 Rydberg. For a functional method, a Perdew-Burke-Ernzerhof (PBE) exchange-correlation functional provided by Quantum ESPRESSO is chosen, and the PAW method is then combined. A bulk system calculates that a k-space grid density is 11×11×11. A surface system obtains 1×3×3 through calculation. In a calculation system, a force convergence condition of each atom is less than $10^{-3}$ eV/Ang. Refer to FIG. 7B and FIG. 7C for a simulation result.

FIG. 7B is a side view of the indium gallium zinc oxide crystal obtained through theoretical calculation. It may be seen from FIG. 7B that a side-view shape of a minimum repetitive unit in the crystal is a rhomboid shown in FIG. 7B. FIG. 7C is a top view of the indium gallium zinc oxide crystal obtained through theoretical calculation. As may be seen from FIG. 7C that a top-view shape of a minimum repetitive unit in the crystal is a rhomboid shown in FIG. 7C. Software that is used to draw the indium gallium zinc oxide crystal in FIG. 7B and FIG. 7C is also VESTA.

Subsequently, FIG. 7B and FIG. 7C are compared with FIG. 8A and FIG. 8B. FIG. 8A is an image obtained after IFFT processing is performed on the HRTEM image of the side view of the crystallized metal oxide semiconductor layer 230a in FIG. 4. FIG. 8B is an image obtained after IFFT processing is performed on the HRTEM image of the top view of the crystallized metal oxide semiconductor layer 230a in FIG. 4.

In FIG. 8A, it may be seen that in the side view, a gap between layer surfaces of the crystallized metal oxide semiconductor layer 230a is 2.6 Å and 2.8 Å. Compared with a simulation result in FIG. 7B, a gap $d_1$ between layers in FIG. 7B is 2.8 Å, and a gap $d_2$ between layers is 2.6 Å. In FIG. 8B, it may be seen that in the top view, the gap between the layer surfaces of the crystallized metal oxide semiconductor layer 230a is 2.5 Å and 2.7 Å. Compared with a simulation result in FIG. 7C, a gap $d_3$ between layers is 2.5 Å, and a gap $d_4$ between layers is 2.7 Å. As may be seen from the foregoing comparison results, the indium gallium zinc oxide crystal established by using the unit cell of the present embodiment is nearly identical with a crystal structure shown in an electron microscope image. It may be seen herein that the indium gallium zinc oxide crystal of the present embodiment can correspond to the internal structure of the metal oxide semiconductor grain in FIG. 4. Therefore, the atom arrangements of the metal oxide semiconductor grain in FIG. 4 in the side view and in the top view can be known from the simulation results in FIG. 7B and FIG. 8B.

According to FIG. 1 to FIG. 8B, it may be known that by means of the method for crystallizing a metal oxide semiconductor layer shown in FIG. 1, after irradiation by a laser, the amorphous metal oxide semiconductor layer can be converted into the crystallized metal oxide semiconductor layer. Because atoms in the crystallized metal oxide semiconductor layer are neatly arranged and there are relatively few vacancies, an etchant does not easily enter the structure, so that the crystallized metal oxide semiconductor layer has a characteristic of resisting corrosion of aluminic acid, hydrofluoric acid, and oxalic acid.

Therefore, by utilizing the advantage of this crystallization method, the present embodiment provides a new semiconductor structure and a method for manufacturing same. FIG. 9A and FIG. 9B are schematic sectional diagrams of a semiconductor structure 700 in various stages of a process according to an embodiment of the present invention.

Referring to the embodiments in FIG. 1 and FIG. 2A to FIG. 2D, a structure shown in FIG. 9A is formed. First, a substrate 710 is received, a gate 712 is formed on the substrate 710, and a gate insulation layer 720 is formed on the gate 712. The material of the gate insulation layer 720 may be an oxide. Subsequently, an amorphous metal oxide semiconductor layer, an oxide layer, and an amorphous silicon layer that are stacked are sequentially formed on the gate insulation layer 720. The amorphous silicon layer is then irradiated by using a laser, to form a crystallized metal oxide semiconductor layer 730a, an oxide layer 740, and a polycrystalline silicon layer 750a shown in FIG. 9A.

Subsequently, the oxide layer 740 and the polycrystalline silicon layer 750a are removed, to form a metal layer covering the crystallized metal oxide semiconductor layer 730a. The metal layer is patterned to form a source 762 and a drain 764 shown in FIG. 9B, to form a BCE type TFT. It should be noted that because the crystallized metal oxide semiconductor layer 730a has a desirable characteristic of resisting acidic corrosion, when a BCE process is performed on the metal layer, an acidic etchant (for example, an aluminic acid etchant, a hydrofluoric acid etchant or an oxalic acid etchant) does not easily cause damage to the crystallized metal oxide semiconductor layer 730a, so that the structure and property of the crystallized metal oxide semiconductor layer 730a that is used as an active layer are kept, thereby increasing a yield of eventually formed TFTs. Because a wet etching process may be used to pattern the metal layer to form a source and a drain, a cost of the process is relatively low.

In an embodiment, the material of the metal layer is molybdenum (Mo), aluminum (Al), copper (Cu), silver (Ag), titanium (Ti), tantalum (Ta), tin (Sn), nickel (Ni), gold (Au), tungsten (W), chromium (Cr), platinum (Pt), an alloy or a combination thereof. In an embodiment, the metal layer is a single metal layer or a metal stack layer. For example, the metal layer is a metal stack layer of molybdenum/aluminum/molybdenum and has a relatively low resistance value.

Subsequently, a passivation layer 770 is formed on the gate insulation layer 720, the crystallized metal oxide semiconductor layer 730*a*, the source 762, and the drain 764. The passivation layer 770 has some openings to expose the drain 764, and a conductive layer 780 is formed on the passivation layer 770 and contacts the drain 764 through these openings, to form the semiconductor structure 700 shown in FIG. 9B. In other words, by means of that the passivation layer 770 does not completely cover the drain 764, the conductive layer 780 can contact the drain 764 through an uncovered portion of the passivation layer 770. In the semiconductor structure 700, the gate 712 is located on the substrate 710, the gate insulation layer 720 is located on the gate 712, the crystallized metal oxide semiconductor layer 730*a* is located on the gate insulation layer 720, the source 762 and the drain 764 are located on the crystallized metal oxide semiconductor layer 730*a*, the passivation layer 770 is located on the source 762 and the drain 764, and the conductive layer 780 contacts the drain 764 through the openings in the passivation layer 770.

Referring to FIG. 10, FIG. 10 is a schematic sectional diagram of a semiconductor structure 800 according to an embodiment of the present invention. A difference between the semiconductor structure 800 and the semiconductor structure 700 lies in that the semiconductor structure 800 has an oxide layer 740 that is located on the crystallized metal oxide semiconductor layer 730*a* and below the source 762 and the drain 764. For a process of manufacturing the semiconductor structure 800, refer to the embodiment of the semiconductor structure 700. The polycrystalline silicon layer 750*a* shown in FIG. 9A is removed. The crystallized metal oxide semiconductor layer 730*a* and the oxide layer 740 are kept on the gate insulation layer 720. A metal layer is formed on the oxide layer 740. The metal layer is patterned to form the source 762 and the drain 764 shown in FIG. 10, to form a TFT having an island structure. Subsequent steps of forming the passivation layer 770 and the conductive layer 780 are then performed, to form the semiconductor structure 800.

FIG. 11A to FIG. 11C are schematic sectional diagrams of a semiconductor structure 900 in various stages of a process according to an embodiment of the present invention. First, a base material is received. The base material includes a substrate 910, a gate 912 located on the substrate 910, and a gate insulation layer 920 located on the gate 912. The material of the gate insulation layer 920 may be an oxide. An amorphous metal oxide semiconductor layer 930, an oxide layer 940, and an amorphous silicon layer 950 are sequentially formed on the base material. The amorphous silicon layer 950 is then irradiated by using a laser 960, so as to heat the amorphous silicon layer 950. The heated amorphous silicon layer 950 heats the amorphous metal oxide semiconductor layer 930, so that the amorphous metal oxide semiconductor layer 930 is converted to form a crystallized metal oxide semiconductor layer 930*a* shown in FIG. 11B. The heated amorphous silicon layer 950 is converted into a polycrystalline silicon layer 950*a*.

Subsequently, the polycrystalline silicon layer 950*a* is removed. The oxide layer 940 is etched to form some openings to expose the crystallized metal oxide semiconductor layer 930*a*. A source 962 and a drain 964 are then formed. The source 962 and the drain 964 penetrate the oxide layer 940 to contact the crystallized metal oxide semiconductor layer 930*a*, to form the semiconductor structure 900 shown in FIG. 11C. This is an embodiment of a TFT having another island structure. Moreover, because the gate 912 is below the crystallized metal oxide semiconductor layer 930*a*, the structure here is a bottom gate structure.

FIG. 12A and FIG. 12B are schematic sectional diagrams of a semiconductor structure 1000 in various stages of a process according to an embodiment of the present invention. After the structure shown in FIG. 11B is formed, the polycrystalline silicon layer 950*a* is patterned, to form a patterned polycrystalline silicon layer 952*a* shown in FIG. 12A. Subsequently, a common electrode is formed to connect the patterned polycrystalline silicon layer 952*a* and a crystallized metal oxide semiconductor layer 930*a*.

In an embodiment, the forming a common electrode includes the following steps: forming a dielectric layer 1010 on the patterned polycrystalline silicon layer 952*a*, forming a gate 1020 on the dielectric layer 1010, forming a dielectric layer 1030 on the gate 1020, and forming an opening 1042, an opening 1044, an opening 1046, and an opening 1048. The opening 1046 and the opening 1048 penetrate the dielectric layer 1010 and the dielectric layer 1030 to expose the patterned polycrystalline silicon layer 952*a*, and the opening 1042 and the opening 1044 penetrate the oxide layer 940, the dielectric layer 1010, and the dielectric layer 1030 to expose the crystallized metal oxide semiconductor layer 930*a*.

Subsequently, a source 1062 is formed in the opening 1042, a drain 1064 is formed in the opening 1044, a source 1066 is formed in the opening 1046, and a drain 1068 is formed in the opening 1048, where the source 1062 is equipotentially connected to the source 1066, so as to form the common electrode.

In the semiconductor structure 1000, the gate 912 is located on the substrate 910, the gate insulation layer 920 is located on the gate 912, the crystallized metal oxide semiconductor layer 930*a* is located on the gate insulation layer 920, the oxide layer 940 is located on the gate insulation layer 920 and the crystallized metal oxide semiconductor layer 930*a*, the patterned polycrystalline silicon layer 952*a* is located on the oxide layer 940, the dielectric layer 1010 is located on the patterned polycrystalline silicon layer 952*a* and the oxide layer 940, the gate 1020 is located on the dielectric layer 1010, and the dielectric layer 1030 is located on the gate 1020. The source 1066 and the drain 1068 are located on the dielectric layer 1030 and penetrate the dielectric layer 1010 and the dielectric layer 1030 to contact the patterned polycrystalline silicon layer 952*a*. The source 1062 and the drain 1064 are located on the dielectric layer 1030 and penetrate the oxide layer 940, the dielectric layer 1010, and the dielectric layer 1030 to contact the crystallized metal oxide semiconductor layer 930*a*. The source 1062 is equipotentially connected to the source 1066.

In the embodiments shown in FIG. 11A and FIG. 11B and FIG. 12A and FIG. 12B, the heated amorphous silicon layer 950 can be used as a heat source, to form the crystallized metal oxide semiconductor layer 930*a* having a characteristic of resisting acidic etching, to form a transistor having an active layer having a characteristic of resisting acidic etching. Meanwhile, the heated amorphous silicon layer 950 is converted into the polycrystalline silicon layer 950*a*. The polycrystalline silicon layer 950*a* may be patterned into the patterned polycrystalline silicon layer 952*a* to be used as an active layer of another transistor. In other words, the amorphous silicon layer 950 has the foregoing two uses. Moreover, by means of the method for manufacturing a semiconductor structure of the present invention, two transistors having different characteristics are effectively manufactured at the same time. For example, the embodiments in FIG. 11A and FIG. 11B and FIG. 12A and FIG. 12B may be used to form a Complementary metal oxide semiconductor (CMOS) structure.

Figure 13:
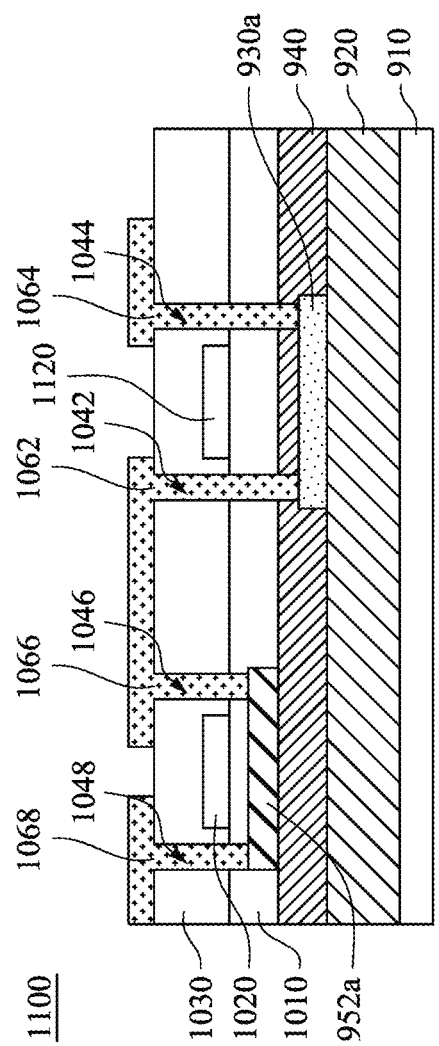
FIG. 13 is a schematic sectional diagram of a semiconductor structure 1100 according to an embodiment of the present invention.

FIG. 13 is a schematic sectional diagram of a semiconductor structure 1100 according to an embodiment of the present invention. In an embodiment, a base material includes a substrate 910 and a gate insulation layer 920 located on the substrate 910. Moreover, before the dielectric layer 1030 is formed on the dielectric layer 1010, the method further includes: forming a gate 1120 on the dielectric layer 1010, where the gate 1120 overlaps a crystallized metal oxide semiconductor layer 930a. Refer to the embodiments in FIG. 12A and FIG. 12B for the step of forming the semiconductor structure 1100, which is no longer elaborated herein. Because the gate 1120 is located on the crystallized metal oxide semiconductor layer 930a, the structure here is a top gate structure.

Figure 14:
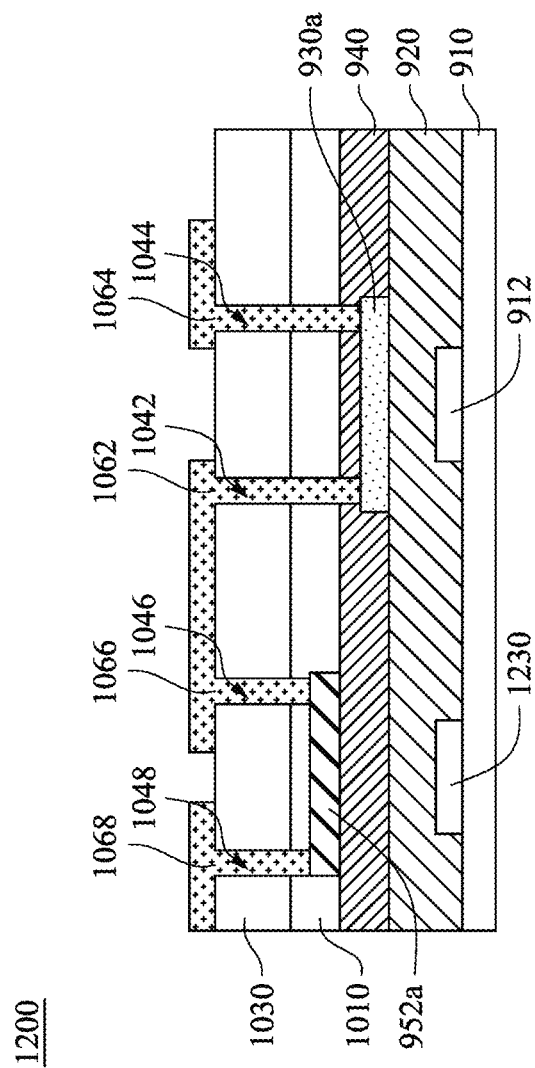
FIG. 14 is a schematic sectional diagram of a semiconductor structure 1200 according to an embodiment of the present invention.

FIG. 14 is a schematic sectional diagram of a semiconductor structure 1200 according to an embodiment of the present invention. In an embodiment, a base material includes a substrate 910, a gate 912, a gate 1230, and a gate insulation layer 920. Moreover, the gate 912 overlaps a crystallized metal oxide semiconductor layer 930a, and the gate 1230 overlaps the patterned polycrystalline silicon layer 952a. Refer to the embodiments in FIG. 12A and FIG. 12B for the step of forming the semiconductor structure 1200, which is no longer elaborated herein. Because the gate 1230 is located below the patterned polycrystalline silicon layer 952a, the structure here is a bottom gate structure.

Figure 15:
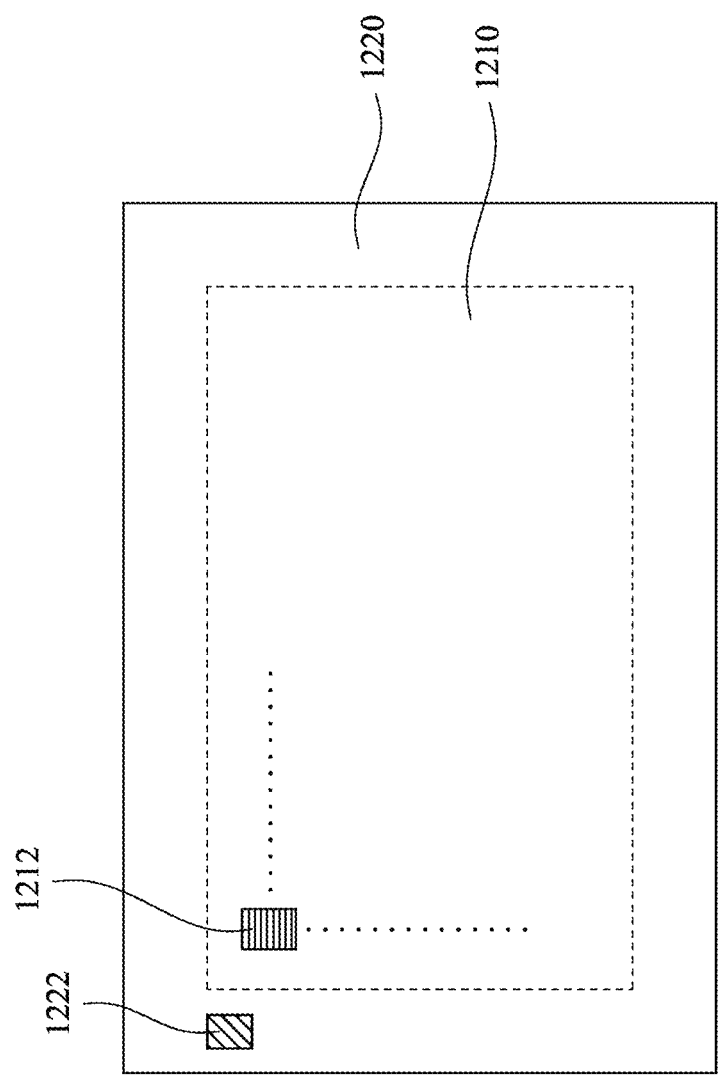
FIG. 15 shows an active array substrate according to an embodiment of the present invention.

Referring to FIG. 15, FIG. 15 shows an active array substrate according to an embodiment of the present invention. The active array substrate includes a display area 1210 and a peripheral area 1220 surrounding the display area 1210. At least one pixel structure 1212 is located inside the display area 1210. The pixel structure 1212 includes a crystallized metal oxide semiconductor transistor. A gate driving circuit 1222 is located inside the peripheral area 1220. The gate driving circuit 1222 includes a polycrystalline silicon transistor.

The crystallized metal oxide semiconductor transistor refers to a transistor in which a crystallized metal oxide semiconductor layer is used as an active layer. For the structural details of the transistor, for example, reference may be made to the semiconductor structure 900, the semiconductor structure 1000, the semiconductor structure 1100 or the semiconductor structure 1200. The crystallized metal oxide semiconductor transistor may have a bottom gate structure or a top gate structure.

The polycrystalline silicon transistor refers to a transistor in which a polycrystalline silicon layer is used as an active layer. For the structural details of the transistor, for example, reference may be made to the semiconductor structure 1000, the semiconductor structure 1100 or the semiconductor structure 1200. For example, as shown in FIG. 12B, the polycrystalline silicon transistor includes a patterned polycrystalline silicon layer 952a, a dielectric layer 1010 located on the patterned polycrystalline silicon layer 952a, a gate 1020 located on the dielectric layer 1010, a dielectric layer 1030 located on the gate 1020, and a source 1066 and a drain 1068 located on the dielectric layer 1030. The source 1066 and the drain 1068 penetrate the dielectric layer 1010 and the dielectric layer 1030 to contact the patterned polycrystalline silicon layer 952a. Moreover, according to the embodiments shown in FIG. 11A and FIG. 11B and FIG. 12A and FIG. 12B, the crystallized metal oxide semiconductor transistor in the pixel structure 1212 and the polycrystalline silicon transistor in the gate driving circuit 1222 can be formed at the same time, and the processes of forming the two transistors are integrated, so as to gain an advantage of simplifying a process.

Although the present invention is disclosed as above by using the embodiments, these embodiments are merely preferred embodiments of the present invention, and are not used to limit the present invention. Any person skilled in the art may make various equivalent changes and modifications without departing from the spirit and scope of the present invention, and therefore the protection scope of the present invention should be as defined by the appended claims.

What is claimed is:

1. A method for crystallizing a metal oxide semiconductor layer, comprising:
    forming an amorphous metal oxide semiconductor layer on a substrate;
    forming an insulating layer on the amorphous metal oxide semiconductor layer;
    forming an amorphous silicon layer on the insulating layer; and
    irradiating the amorphous silicon layer by a laser so that the amorphous metal oxide semiconductor layer is converted into a crystallized metal oxide semiconductor layer.

2. The method for crystallizing the metal oxide semiconductor layer of claim 1, further comprising forming a first oxide layer between the amorphous metal oxide semiconductor layer and the substrate.

3. A semiconductor structure, comprising:
    a substrate;
    a first gate, located on the substrate;
    a gate insulation layer, located on the first gate;
    a crystallized metal oxide semiconductor layer, located on the gate insulation layer;
    an oxide layer, located on the gate insulation layer and the crystallized metal oxide semiconductor layer;
    a patterned polycrystalline silicon layer, located on the oxide layer;
    a second gate, located between the substrate and the gate insulation layer, and overlapping the patterned polycrystalline silicon layer;
    a first dielectric layer, located on the patterned polycrystalline silicon layer;
    a second dielectric layer, located on the first dielectric layer;
    a first source and, a first drain, located on the crystallized metal oxide semiconductor layer, wherein the first source is located on the second dielectric layer, and penetrates the oxide layer, the first dielectric layer, and the second dielectric layer to contact the crystallized metal oxide semiconductor layer, the first drain penetrates the oxide layer, the first dielectric layer, and the second dielectric layer to contact the crystallized metal oxide semiconductor layer, the crystallized metal oxide semiconductor layer comprises a plurality of metal oxide semiconductor grains, each respective metal oxide semiconductor grain of the plurality of metal oxide semiconductor grains has a respective crystallographic axis, and each respective crystallographic axis is approximately parallel to each other;
    a second source, located on the second dielectric layer, and penetrating the first dielectric layer and the second dielectric layer to contact the patterned polycrystalline silicon layer; and a second drain, located on the second dielectric layer, and penetrating the first dielectric layer and the second dielectric layer to contact the patterned polycrystalline silicon layer, wherein the first source is equipotentially connected to the second source, wherein each respective metal oxide semiconductor grain of the plurality of metal oxide semiconductor grains has a layer-form structure, and a layer surface of the layer-form structure is approximately parallel to a surface of the crystallized metal oxide semiconductor layer.

4. The semiconductor structure according to claim 3, wherein each respective crystallographic axis is approximately perpendicular to the surface of the crystallized metal oxide semiconductor layer.

5. The semiconductor structure according to claim 3, wherein the crystallized metal oxide semiconductor layer comprises indium gallium zinc oxide, indium tin zinc oxide, hafnium indium zinc oxide or indium zinc oxide.

6. The semiconductor structure according to claim 3, wherein a size of each respective metal oxide semiconductor grain of the plurality of metal oxide semiconductor grains is between approximately 1 nanometer and approximately 5.5 nanometers.

7. The semiconductor structure according to claim 3, wherein an included angle between each respective crystallographic axis and a normal of an upper surface of the crystallized metal oxide semiconductor layer is between 0 degree and 7 degrees.

8. A semiconductor structure, comprising:
a substrate;
a crystallized metal oxide semiconductor layer, located on the substrate, comprising a plurality of metal oxide semiconductor grains, each respective metal oxide semiconductor grain of the plurality of metal oxide semiconductor grains having a respective crystallographic axis, and each respective crystallographic axis being approximately parallel to each other;
an oxide layer, located on the crystallized metal oxide semiconductor layer;
a patterned polycrystalline silicon layer, located on the oxide layer;
a first dielectric layer, located on the patterned polycrystalline silicon layer;
a first gate, located on the first dielectric layer;
a second gate, located on the first dielectric layer;
a second dielectric layer, located on the first gate and the second gate;
a first source, located on the second dielectric layer, and penetrating the oxide layer, the first dielectric layer, and the second dielectric layer to contact the crystallized metal oxide semiconductor layer;
a first drain, located on the second dielectric layer, and penetrating the oxide layer, the first dielectric layer, and the second dielectric layer to contact the crystallized metal oxide semiconductor layer;
a second source, penetrating the first dielectric layer and the second dielectric layer to contact the patterned polycrystalline silicon layer, and the second source being equipotentially connected to the first source; and
a second drain, located on the second dielectric layer, and penetrating the first dielectric layer and the second dielectric layer to contact the patterned polycrystalline silicon layer.

* * * * *